United States Patent [19]
Shi et al.

[11] Patent Number: 5,804,322
[45] Date of Patent: Sep. 8, 1998

[54] ORGANIC ELECTROLUMINESCENCE DEVICE WITH MIXED HOLE TRANSPORTING MATERIALS

[75] Inventors: Song Q. Shi, Phoenix; Cynthia A. Gorsuch, Glendale, both of Ariz.

[73] Assignee: Motorola, Inc., Schaumburg, Ill.

[21] Appl. No.: 560,453

[22] Filed: Nov. 17, 1995

[51] Int. Cl.$^6$ .................................................. H05B 33/00
[52] U.S. Cl. ........................ 428/690; 428/917; 428/448; 428/450; 428/457; 428/704; 313/504; 313/506
[58] Field of Search ..................................... 428/457, 690, 428/704, 917, 448, 450; 313/504, 506

[56] References Cited

U.S. PATENT DOCUMENTS

| | | | |
|---|---|---|---|
| 4,720,432 | 1/1988 | Van Slyke et al. | 428/457 |
| 4,950,950 | 8/1990 | Perry et al. | 313/504 |
| 5,061,569 | 10/1991 | Van Slyke et al. | 428/457 |
| 5,256,945 | 10/1993 | Imai et al. | 313/504 |
| 5,336,546 | 8/1994 | Hironaka et al. | 428/209 |
| 5,374,489 | 12/1994 | Imai et al. | 428/690 |
| 5,420,351 | 5/1995 | Suzuki et al. | 564/308 |
| 5,487,953 | 1/1996 | Shirota et al. | 428/690 |
| 5,508,136 | 4/1996 | Shirota et al. | 430/73 |

FOREIGN PATENT DOCUMENTS 0 650 955 A1  5/1995  European Pat. Off. .

OTHER PUBLICATIONS

Terrell, D. "Electroluminescent Device and Substances Suited for Use Therein", Research Disclosure, Jul. 1992, No. 339, pp. 571–573.

Naito, K. et al., "Molecular Design for Nonpolymeric Organic Dye Glasses . . . ", The Journal of Physical Chemistry, vol. 97, No. 23, Jun. 1993, pp. 6240–6248.

Adachi, C. et al. "Molecular Design of Hole Transport Materials . . . ", Applied Physics Letters, vol. 66, No. 20, May 1995, pp. 2679–2681.

*Primary Examiner*—Marie R. Yamnitzky
*Attorney, Agent, or Firm*—Eugene A. Parsons

[57] ABSTRACT

An organic electroluminescent device is disclosed which has a cathode, an electron transporting zone, an emitting zone, an hole transporting zone and an anode that are laminated in sequence. The hole transporting zone includes at least one hole transporting layer fabricated with two or more homogeneously mixed hole transporting materials each having a glass transition temperature above 75° C. and which are structurally compatible.

4 Claims, 1 Drawing Sheet

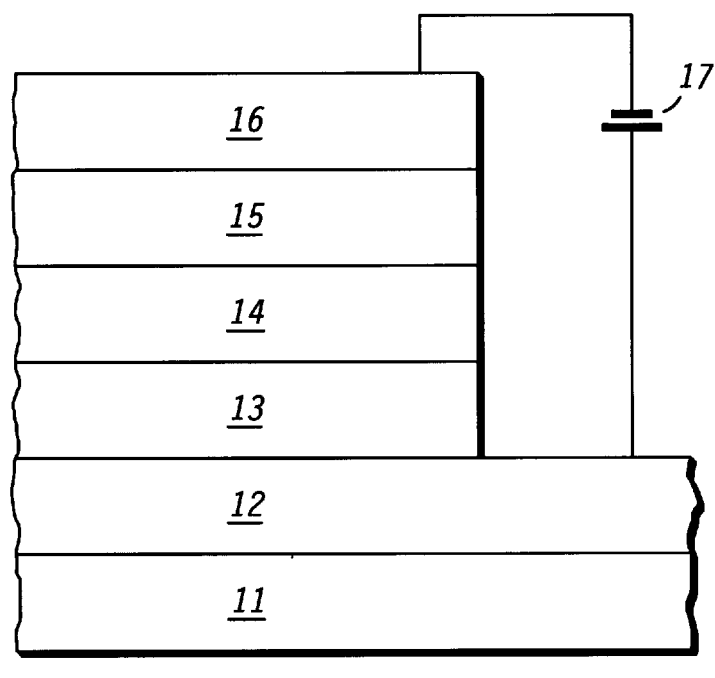

ORGANIC ELECTROLUMINESCENCE DEVICE WITH MIXED HOLE TRANSPORTING MATERIALS

Field of the Invention

This invention relates to an organic electroluminescence (EL) device, and more particularly to an organic EL device where two or more mixed hole transporting materials are used in a hole transporting layer.

BACKGROUND OF THE INVENTION

Organic electroluminescent (EL) devices are generally composed of three zones of organic molecules sandwiched between transparent and metallic electrodes, the three zones include an electron transporting zone, an emissive zone and a hole transporting zone. Organic EL devices are attractive, owing chiefly to low driving voltage, with a potential application to full color flat emissive displays. Though significant lifetime has been achieved in the prior art (See U.S. Pat. No. 4,720,432, entitled "Electroluminescent device with Organic Luminescent Medium", issued Jan. 19, 1988), further improvement is needed for applications where high brightness is required. In general, the hole transporting materials used in the hole transporting zone of an organic EL device are the most vulnerable parts which are susceptible to thermal degradation by physical aggregation or recrystallization.

To address the thermal degradation problem of the hole transporting materials in an organic EL device, several schemes have been proposed: one being a double-layer hole transporting configuration (see U.S. Pat. No. 5,256,945, entitled "Organic electroluminescence Element". issued Oct. 26, 1993); one being usage of materials of high glass transition temperatures (see U.S. Pat. No. 5,061,569, entitled "Electroluminescent Device with Organic Electroluminescent Medium", issued Oct. 29, 1991).

It is a purpose of this invention to provide a new device and method to reduce the thermal degradation of the hole transporting materials in the hole transporting zone of an organic EL device. As a result, the durability of an organic EL device is significantly improved.

SUMMARY OF THE INVENTION

To at least partially solve the above problems and others and to realize the above purpose a new and improved organic EL device is provided which includes a cathode, an electron transporting zone, an emitting zone, an hole transporting zone and an anode that are laminated in sequence. The hole transporting zone is made of one or two hole transporting layers, wherein at least one hole transporting layer is comprised of two or more homogeneously mixed hole transporting materials which are structurally compatible.

According to the present invention, there is obtained an organic EL device with an improved lifetime by suppression of the aggregation or recrystallization tendency of hole transporting materials.

BRIEF DESCRIPTION OF THE DRAWING

The single figure is a simplified sectional view of a light emitting diode in accordance with the present invention.

DESCRIPTION OF THE PREFERRED EMBODIMENTS

The present invention is directed to a new scheme for use in organic light emitting devices which, in general, consist of thin layers of organic molecules sandwiched between transparent and metallic electrodes.

The single FIG. illustrates in a simplified cross-sectional view, one embodiment of an organic light emitting device (LED) 10. Organic LED 10 includes a transparent substrate 11 which in this specific embodiment is a glass or plastic plate having a relatively planar upper surface. A transparent electrically conductive layer 12 is deposited on the planar surface of substrate 11 so as to form a relatively uniform electrical contact. An hole transporting zone 13 made of organic hole transporting materials is deposited on the surface of conductive layer 12. A light emission zone 14 made of a host emissive material containing a guest fluorescent dopant is deposited onto the surface of hole transporting zone 13. Then an electron transporting zone 15 made of an electron transporting material is deposited on the surface of light emission zone 14 and a second electrically conductive layer 16 is deposited on the upper surface of electron transporting zone 15 to form a second electrical contact.

In this embodiment, conductive layer 16 is formed of any of a wide range of metals or alloys in which at least one metal has a work function less than 4.0 eV. By the proper selection of material for conductive layer 16, the work functions of the materials making up layers 15 and 16 are substantially matched to reduce the required operating voltage and improve the efficiency of organic LED 10. Additional information on work function matching is disclosed in a copending U.S. Patent Application entitled "Organic LED with Improved Efficiency", filed 12 Sep., 1994, bearing Ser. No. 08/304,454, and assigned to the same assignee.

In this embodiment conductive layer 12 is a p-type contact and conductive layer 16 is an n-type contact. A negative terminal of a potential source 17 is connected to conductive layer 16 and a positive terminal is connected to conductive layer 12. When a potential is applied between layers 12 and 16 by means of potential source 17, electrons injected from the n-type contact (layer 16) are transported through organic layer 15 and into organic layer 14 (the emissive layer) and holes injected from the p-type contact (layer 12) are transported through organic layer 13 and into organic layer 14 (the emissive layer), where upon an electron and a hole recombination a photon is emitted.

It has been recognized that the hole transporting materials made up of tertiary aromatic amines are the least thermally stable materials in organic electroluminescent devices. Especially, when an organic EL device is driven at high electric current density, the hole transporting materials in the hole transporting zone tend to aggregate or reorganize to form islands, domains and pinholes. The change in film uniformity and homogeneity of the hole transporting materials initially causes a graduated degradation in device luminance and eventually the device failure.

Generally, the glass transition temperature ($T_g$) of a material is an indicator for thermal stability of the resulting amorphous films. A higher glass transition temperature offers higher thermal stability for an amorphous film. A large molecular weight and strong steric hindrance to stacking are two of the main factors that determine the glass transition temperature of an organic material.

In an effort to improve the reliability of organic EL materials, Shirota (see J. Phys. Chem. 1993, 7, 6240 and reference within) and Adachi (Appl. Phys. Lett, 1995, 66 (20), 2679) have designed and prepared several symmetric globular tertiary aromatic amines with high $T_g$, yielding homogeneous amorphous films for organic EL applications.

In the prior art, the following compounds represented by HTM-1, HTM-2 and HTM-3 and HTM-4 are a few organic hole transporting materials with $T_g$ above 75° C. which give improved lifetimes when used in organic EL devices.

However, it is preferred that hole transporting materials having a glass transition temperature greater then 90° C. are used to achieve a longer lasting organic EL device 10.

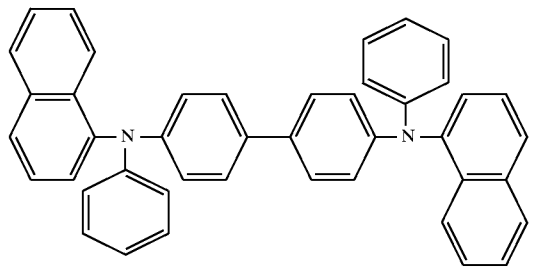

HTM-1

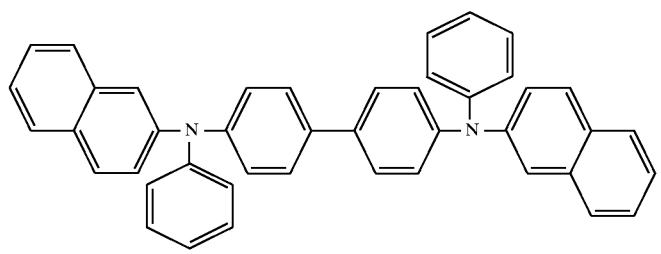

HTM-2

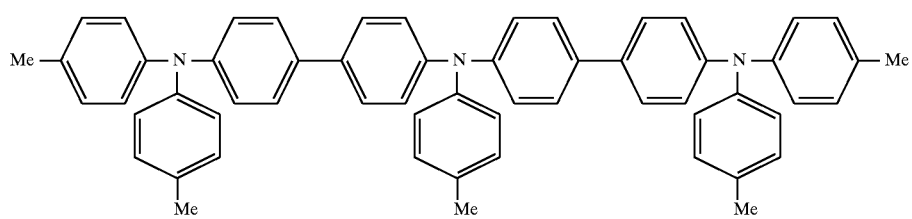

HTM-3

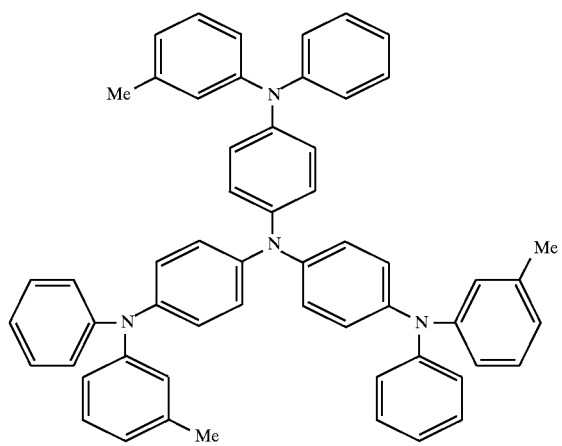

HTM-4

Since at present almost all reliable organic EL devices are fabricated with evaporative technology, improving device reliability by increasing $T_g$ of hole transporting materials has some limits. When $T_g$ reaches a certain point, the molecular weight of an organic molecule may be so large that it is no longer sublimable or evaporatable.

According to the present invention, organic EL device 10 as illustrated in the figure includes hole transporting zone 13 made of one or two hole transporting layers, wherein at least one of the hole transporting layers includes two or more homogeneously mixed hole transporting materials that are structurally compatible. It is desirable that each of the individual hole transporting materials used in hole transporting zone 13 in organic EL device 10 has a glass transition temperature, before mixing, above 75° C.

It should be emphasized that the hole transporting materials with $T_g$ below 75° C. may not give a very stable device even when used as a mixture. For instance, an organic EL device fabricated with TPD, having a $T_g$ of 63° C., as hole transporting material only has a lifetime of a few hours, while fabricating the same device with TPDs (illustrated below) containing a mixture of TPD (86.5%), TPD-1 (13.1%), TPD-2 (0.4%) as hole transporting material has a somewhat better, yet still short, lifetime of a couple dozen hours. The mixture of TPD with its two derivatives has less tendency to crystallize then anyone of the materials alone, thus making the mixture more desirable but still not as stable as required for longer lasting organic EL devices.

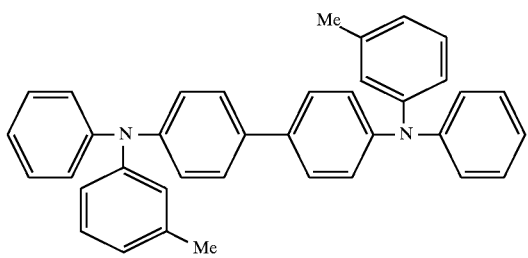
TPD

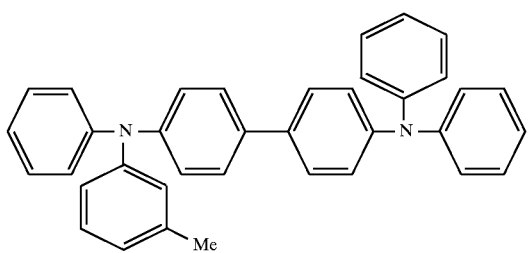
TPD-1

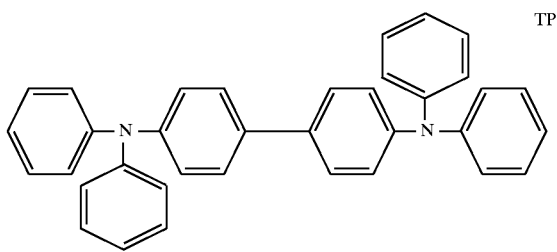
TPD-2

Hole transporting materials used in accordance with the present invention include organic tertiary aromatic amines with $T_g$ greater then 75° C. The aromatic amines have a general structure of

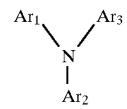

where: $Ar_1$, $Ar_2$ and $Ar_3$ are independently aromatic hydrocarbons or aromatic tertiary amine moieties. The aromatic hydrocarbons and the aromatic tertiary amine moieties in turn can be substituted. Typical substituents include alkyl groups, alkoxy groups, alkylamine groups, aryl groups, aryloxy groups, arylamine groups and halogen such as bromide, chloride, and fluoride.

The following is an exemplary list of a few classes of aromatic tertiary amines satisfying the requirement of the present invention:

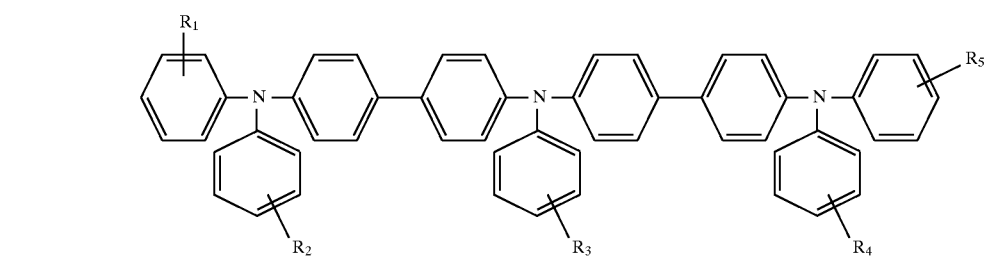
Class-1

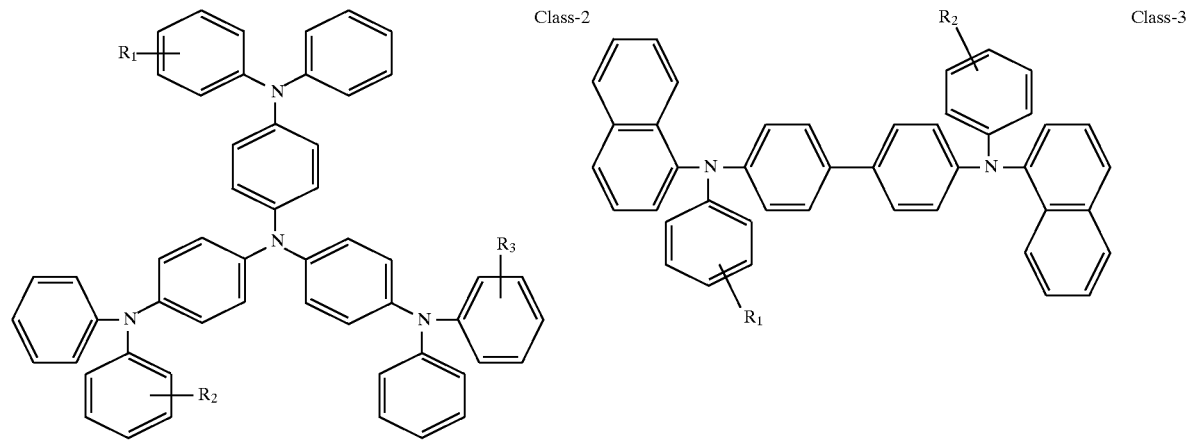
Class-2  Class-3

-continued

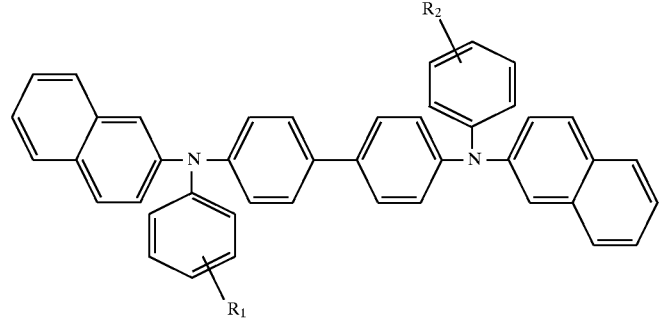

Class-4

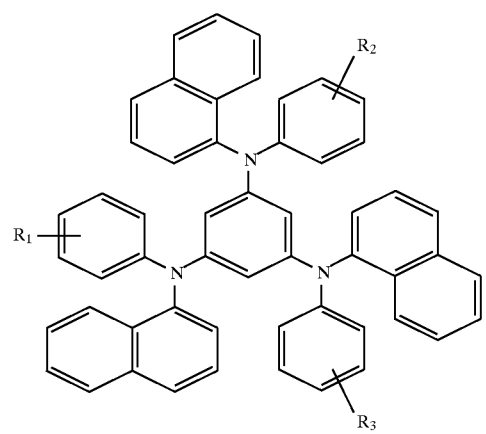

Class-5

Where $R_1$, $R_2$, $R_3$, $R_4$ and $R_5$ are independently selected from alkyl groups, alkoxy groups, alkylamine groups, aryl groups, aryloxy groups, arylamine groups and halogen such as bromide, chloride, and fluoride; each of $R_1$, $R_2$, $R_3$, $R_4$ and $R_5$ may also be an independently fused aromatic ring.

In this specific embodiment, the two or more hole transporting materials mixed in one layer of hole transporting zone 13 of organic EL device 10 can be from any of the different classes, such as Class-1, Class-2, Class-3, Class-4, Class-5, mentioned above as long as a homogeneous, uniform and stable amorphous film is obtained. However, it is preferred that materials from the same class with similar structures but different substituents on their backbone structures, namely, homologous, are mixed in a layer of hole transporting zone 13 of organic EL device 10 to achieve the best results. For example, HTM-1 (described above) from Class-3 can be mixed with the following two hole transporting materials (HTM-5 and HTM-6) also from Class-3 in any pre-determined ratio:

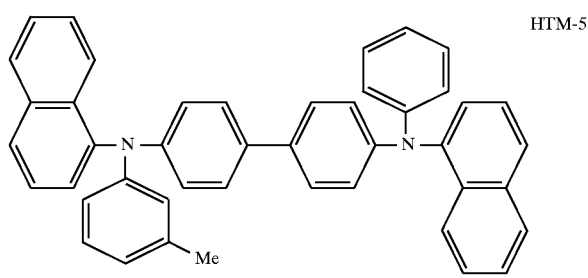

HTM-5

-continued

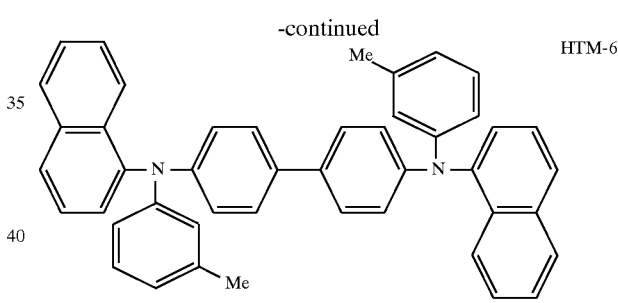

HTM-6

The mixing of two hole transporting materials in one layer of hole transporting zone 13 can be achieved by several methods including pre-mixing and co-evaporation. The pre-mixing method involves physically mixing two or more hole transporting materials in a pre-determined ratio to a homogeneous state before the mixture is loaded into an evaporation boat for device fabrication. The pre-mixing method is used when all hole transporting materials to be mixed have a similar sublimation temperature. The co-evaporation method involves evaporating different hole transporting materials from different evaporation boats simultaneously. The mixing ratio is determined by the relative evaporation rate of each material. The co-evaporation method is used when the hole transporting materials to be mixed have substantial differences in sublimation temperature. The pre-mixing method is generally preferred for its simple, more cost-effective process as compared to the co-evaporation method.

Although, at the present time the most reliable organic EL devices are fabricated mainly with the previously discussed aromatic tertiary amines as a hole transporting material, other organic hole transporting materials such as aromatic silanes, aromatic silazanes and aromatic phosphine can also be used in the present invention as long as those materials have a $T_g$ greater then 75° C.:

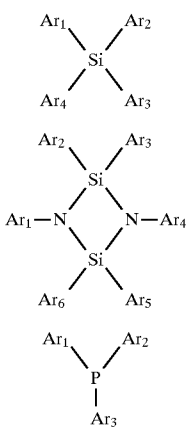

Silanes

Silazanes

Phosphines where: $Ar_1$ through $Ar_6$ are independently aromatic hydrocarbons or aromatic tertiary amine moieties. The aromatic hydrocarbons and the aromatic tertiary amine moieties in turn can be substituted. Typical substituents includes alkyl groups, alkoxy groups, alkylamine groups, aryl groups, aryloxy groups, arylamine groups and halogen such as bromide, chloride, and fluoride.

While we have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. An organic electroluminescence device with a cathode, an electron transporting zone, an emitting zone, a hole transporting zone and an anode which are laminated in sequence, wherein said hole transporting zone includes at least one hole transporting layer comprising a mixture of a plurality of homogeneously mixed hole transporting materials each having a glass transition temperature above 75° C., the hole transporting materials forming a stable, homogeneous, uniform film, the mixture having less tendency to crystallize than any of the plurality of homogeneously mixed hole transporting materials individually, whereby device lifetime is improved.

2. An organic electroluminescence device as claimed in claim 1, wherein the hole transporting materials are selected from organic tertiary aromatic amines having a general structure of

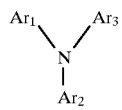

where: $Ar_1$, $Ar_2$ and $Ar_3$ are independently aromatic hydrocarbons, or aromatic tertiary amine moieties, and wherein the aromatic hydrocarbons and the aromatic tertiary amine moieties in turn can be substituted with substituents selected from alkyl groups, alkoxy groups, alkylamine groups, aryl groups, aryloxy groups, arylamine groups and halogens.

3. An organic electroluminescence device as claimed in claim 2, wherein the hole transporting materials are selected from organic tertiary aromatic amines having at least one of the following chemical formulae:

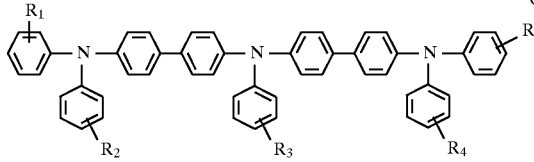

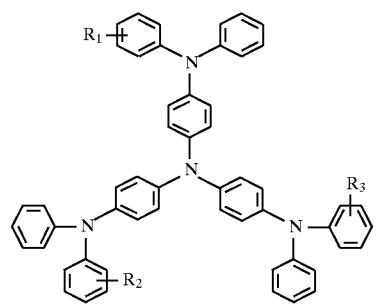

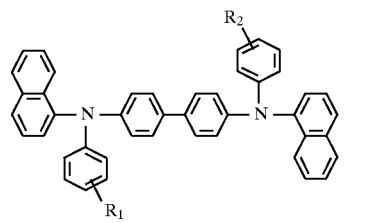

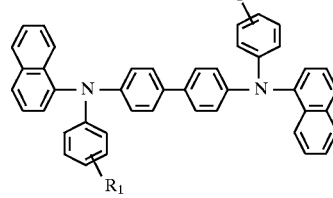

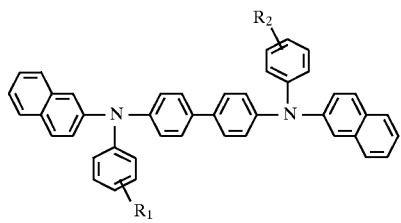

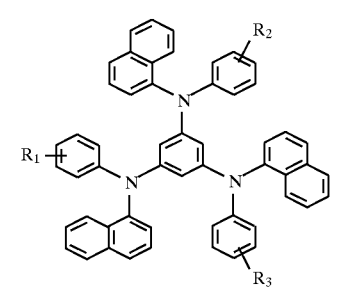

where $R_1$, $R_2$, $R_3$, $R_4$ and $R_5$ are independently selected from alkyl groups, alkoxy groups, alkylamine groups, aryl groups, aryloxy groups, arylamine groups, halogens, and a fused aromatic ring.

4. An organic electroluminescence device as claimed in claim 1, wherein the hole transporting materials are selected from organic aromatic silanes, aromatic silazanes and aromatic phosphine with general formulae:

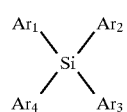

Silanes

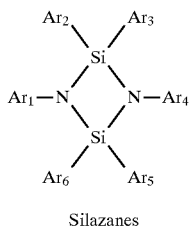

Silazanes

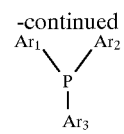

Phosphines where: $Ar_1$ through $Ar_6$ are independently aromatic hydrocarbons, or aromatic tertiary amine moieties, and wherein the aromatic hydrocarbons and the aromatic tertiary amine moieties in turn can be substituted with substituents selected from alkyl groups, alkoxy groups, alkylamine groups, aryl groups, aryloxy groups, arylamine groups and halogens.

* * * * *